United States Patent
Brantley et al.

(10) Patent No.: US 8,890,610 B2
(45) Date of Patent: Nov. 18, 2014

(54) COMPENSATION CIRCUITRY AND METHOD FOR AMPLIFIERS DRIVING LARGE CAPACITIVE LOADS

(71) Applicant: Texas Instruments Incorporated, Dallas, TX (US)

(72) Inventors: Steven G. Brantley, Satellite Beach, FL (US); Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 31 days.

(21) Appl. No.: 13/761,357

(22) Filed: Feb. 7, 2013

(65) Prior Publication Data

US 2014/0218112 A1 Aug. 7, 2014

Related U.S. Application Data

(60) Provisional application No. 61/616,579, filed on Mar. 28, 2012.

(51) Int. Cl.
*H03F 3/45* (2006.01)
*H03F 1/22* (2006.01)

(52) U.S. Cl.
CPC ............ *H03F 3/45071* (2013.01); *H03F 1/223* (2013.01)
USPC .......................................... 330/254; 330/292

(58) Field of Classification Search
USPC .......................................... 330/252–261, 292
See application file for complete search history.

(56) References Cited

U.S. PATENT DOCUMENTS 7,639,078 B2 * 12/2009 Rayanakorn et al. ......... 330/255

OTHER PUBLICATIONS

"An Uncoditionally Stable Two-Stage CMOS Amplifier" by Richard J. Reay and Gregory T. A. Kovacs, IEEE Journal of Solid-State Circuits, vol. 30, No. 4, May 1995, pp. 591-594.
"A Three-Stage Amplifier with Quenched Multipath Frequency Compansation for All Capacitive Loads" by Jingjing Hu, Johan H. Huijsing and Kofi A. A. Makinwa, IEEE 2007, pp. 225-228.
"Three-Stage Large Capacitive Load Amplifier with Damping-Factor-Control Frequency Compensation" by Ka Nang Leung et al., IEEE Transactions on Solid-State Circuits, vol. 35, No. 2, Feb. 2000, pp. 221-230.

* cited by examiner

*Primary Examiner* — Hieu Nguyen
(74) *Attorney, Agent, or Firm* — John R. Pessetto; Frederick J. Telecky, Jr.

(57) ABSTRACT

An operational amplifier (10) capable of driving a capacitive load ($C_{LOAD}$) and/or a resistive load ($R_{LOAD}$) includes a first gain stage (2) having an output coupled to a high impedance node (3) and a second gain stage (5) having an input coupled to the first high impedance node. A gain reduction resistor ($R_D$) and an AC coupling capacitor ($C_D$) are coupled in series between the high impedance node and a reference voltage. A Miller feedback capacitor ($C_M$) is coupled between an output conductor (7) of the second gain stage and the high impedance node. The output of the second gain stage may be coupled to the high impedance node by a cascode transistor ($M_{CASCODE}$).

8 Claims, 4 Drawing Sheets

COMPENSATION CIRCUITRY AND METHOD FOR AMPLIFIERS DRIVING LARGE CAPACITIVE LOADS

CROSS REFERENCE TO RELATED APPLICATION

This application claims the benefit of prior filed co-pending U.S. provisional application Ser. No. 61/616,579 filed Mar. 28, 2012, entitled "Compensation Approach for Amplifiers with Large Capacitive Loads" by Steven Graham Brantley and Vadim Valerievich Ivanov, and incorporated herein by reference.

BACKGROUND OF THE INVENTION

The present invention relates generally to operational amplifiers, and more particularly to improvements which reduce power consumption while also providing high dynamic range in general purpose operational amplifiers capable of driving both large and small load capacitances and also capable of driving resistive loads. Traditionally, the main way to increase the capacitive load drive of a Miller compensated amplifier has been to increase the power consumption of the output stage. There are a number of amplifier compensation approaches described in the literature that attempt to achieve high capacitive load drive with less power than is required for a Miller compensated amplifier. There normally are trade-offs for these approaches that compromise the resulting amplifier's performance in some way. A variation of a two-gain-stage Miller compensated amplifier that can be made stable driving any load capacitance, if the gain of the first stage is made low enough, is described in the article "An Unconditionally Stable Two-Stage CMOS Amplifier" by Reay, R. J. and Kovacs, G. T. A., IEEE Journal of Solid-State Circuits, May 1995, Volume: 30, Issue: 5, pages 591-594. This approach works well for some applications, but it has low open loop gain when driving resistive loads, and it also has stability issues when driving small load capacitances in the presence of DC load currents.

A three gain stage approach which has higher gain compared to the Reay two-stage approach is presented in "A Three-Stage Amplifier with Quenched Multipath Frequency Compensation for All Capacitive Loads" by Jingjing Hu, Huijsing, J. H., and Makinwa, K. A. A., IEEE International Symposium on Circuits and Systems, New Orleans, La., May 27-30, 2007, pages 225-228. The three-stage amplifier technique disclosed in that reference works well for driving high capacitive loads but has stability problems at small capacitive loads and high DC load currents, due to the phase shift added by the second gain stage. High DC load currents increase the bandwidth of the third stage, and result in excessive bandwidth in the Miller loop when driving small load capacitances.

Another three-gain-stage approach to driving large load capacitance is disclosed in the article "Three-Stage Large Capacitive Load Amplifier with Damping-Factor-Control Frequency Compensation" by Leung et al., IEEE transactions on solid-state circuits, Vol. 35, No. 2, February, 2000, pages 221-230. This approach uses the second gain stage to boost the forward gain of the Miller feedback loop, and also uses an active damping network to control the phase shift from the second stage. The additional gain provided by the second gain stage improves the capacitive load drive by increasing the unity gain-bandwidth of the Miller feedback loop.

Prior Art FIG. 1A shows an ordinary two-stage operational amplifier 1A including a first gain stage 2 having its output connected by a high impedance node 3 to the input of a second gain stage 5. The output of gain stage 5 is connected by output conductor 7 to produce Vout, which is fed back to high impedance node 3 by means of Miller feedback capacitor $C_M$.

Similarly, Prior Art FIG. 1B shows a two-stage operational amplifier 1B including a first transconductance stage 2 which has transconductance G1. First gain stage 2 may be configured as an inverting stage, wherein its (+) input receives an input signal $Vin^+$ and its (−) input receives the input signal $Vin^-$. The output terminal of first stage 2 is connected by conductor 3 to the input of an inverting second transconductance stage 5 having a transconductance G2. Conductor 3, which is referred to as a high impedance node, is connected to one terminal of a gain reduction (damping) resistor $R_D$ (which is similar to resistor R1 in the Reay paper), the other terminal of which is connected to ground. High impedance node 3 also is connected to the drain of a P-channel cascode transistor $M_{CASCODE}$. A parasitic capacitance C1 is coupled to high impedance node 3. The gate of $M_{CASCODE}$ is coupled to a suitable bias voltage, and its source is coupled by conductor 6 to one terminal of a Miller feedback capacitor $C_M$, the other terminal of which is connected by conductor 7 to the output of second stage 5. Conductor 6 is referred to as a "cascode point". An output voltage Vout is generated on conductor 7, and is applied to a load capacitance $C_{LOAD}$.

The architecture of FIG. 1B works best for operational amplifiers that drive purely capacitive loads (ie., loads which draw no significant DC output current and which present no load resistance). If the gain of first stage 2 is reduced by lowering the damping (i.e., gain reduction) resistance $R_D$ at the output of first stage 2, then the RC pole at that point caused by damping resistor $R_D$ and parasitic capacitance C1 may occur at a sufficiently high frequency that its phase shift will not destabilize operational amplifier 1B when the pole due to the output stage starts to cause the overall amplifier response to become unstable. Lowering the gain of the first stage by means of gain reduction resistor $R_D$ moves the foregoing RC pole to a higher frequency.

Also, Miller feedback capacitor $C_M$ is connected to cascode point 6 to prevent $C_M$ from excessively loading high impedance node 3 at the input of second amplifier stage 5. This allows a higher value of resistance of the damping resistor $R_D$ to be used.

The reduced gain of the first gain stage 2 means that operational amplifier 1B of Prior Art FIG. 1B must rely mainly on second amplifier stage 5 to achieve the required overall amplifier gain. Unfortunately, that results in operational amplifier 1B having lower DC gain when it drives a resistive load. Furthermore, the connecting of Miller capacitor $C_M$ to cascode point 6 results in a second pole in the Miller feedback loop, and that second pole usually results in stability problems if the operational amplifier 1B is utilized to drive a low value of load capacitance $C_{LOAD}$, unless the value of transconductance G2 is a relatively well known quantity. Since the value of G2 normally varies with DC load current, operational amplifier 1B is difficult to keep stable at small load capacitance with large variations in DC load current.

The high gain achieved in operational amplifier 1B by reducing the gain by means of damping resistor $R_D$ and by relying on second stage 5 for most of the overall amplifier gain is lost if operational amplifier 1B drives a resistive load, because the resistive load sharply reduces the second stage gain.

One problem with the prior architecture of FIG. 1B is that it is not able to drive a resistive load and nevertheless have a sufficiently high gain for many applications, because the gain of the first stage is already low, and any resistive load lowers the gain of the second stage, and hence the entire amplifier, to roughly 200. However, a gain of 100,000 or more typically is desirable. Stated differently, the operational amplifier gain with a resistive load is likely to be in the range of 30 to 50 DB, whereas a gain of 100 DB is what is desired.

Thus, a gain-reduced two-stage amplifier with cascoded Miller compensation as shown in Prior Art FIG. 1B is mainly suitable for driving capacitance loads but suffers from low DC gain when driving resistive loads, and also suffers from stability problems when driving a low capacitance load in the presence of widely varying DC load currents. Unfortunately, the main prior way of increasing the gain of the second stage 5 has been to increase its power consumption. However, it would be highly advantageous to be able to increase the second stage gain without greatly increasing the power consumption.

Thus, there is an unmet need for a general purpose operational amplifier capable of driving high load capacitance and a wide range of current and resistive loading, while maintaining high gain and precision but dissipating substantially less power than in prior general purpose operational amplifiers.

There also is an unmet need for a two-stage operational amplifier which does not achieve essentially all of its gain from its second stage.

There also is an unmet need for an operational amplifier which does not lose a large amount of gain when the operational amplifier is driving a resistive load.

There also is an unmet need for an operational amplifier which does not lose a large amount of gain while driving a resistive load and which consumes a relatively low amount of power.

There also is an unmet need for a general purpose operational amplifier which achieves adequate gain while driving either a low or high capacitance load and/or a resistive load.

SUMMARY OF THE INVENTION

It is an object of the invention to provide a compensation technique for a general purpose operational amplifier capable of driving high load capacitance and a wide range of current and resistive loads, while maintaining high gain and precision but dissipating substantially less power than in prior general purpose operational amplifiers.

It is another object of the invention to provide a two-stage operational amplifier which does not achieve essentially all of its gain from its second stage.

It is another object of the invention to provide an operational amplifier which does not lose a large amount of gain when the operational amplifier is driving a resistive load.

It is another object of the invention to provide an operational amplifier which does not lose a large amount of gain while driving a resistive load and which consumes a relatively low amount of power.

It is another object of the invention to provide general purpose operational amplifier which achieves adequate gain while driving either a low or high capacitance load and/or a resistive load.

Briefly described, and in accordance with one embodiment, the present invention provides an operational amplifier (10) capable of driving a capacitive load ($C_{LOAD}$) and/or a resistive load ($R_{LOAD}$) and includes a first gain stage (2) having an output coupled to a high impedance node (3) and a second gain stage (5) having an input coupled to the first high impedance node. A gain reduction resistor ($R_D$) and an AC coupling capacitor ($C_D$) are coupled in series between the high impedance node and a ground voltage. A Miller feedback capacitor ($C_M$) is coupled between an output conductor (7) of the second gain stage and the high impedance node. The output of the second gain stage may be coupled to the high impedance node by a cascode transistor ($M_{CASCODE}$).

In one embodiment, the invention provides amplifier circuitry (10) including a first gain stage (2) having an output coupled to a first high impedance node (3,3-1,3-2); a first gain reduction resistor ($R_D, R_{D1}, R_{D2}$) and a first AC coupling capacitor ($C_D, C_{D1}, C_{D2}$) coupled in series between the first high impedance node (3,3-1,3-2) and a first reference voltage (GND); a second gain stage (5) having an input coupled to the first high impedance node (3,3-1,3-2); and a first Miller feedback capacitor ($C_M, C_{M1}, C_{M2}$) coupled between an output conductor (7) of the second gain stage (5) and the first high impedance node (3,3-1,3-2). In one embodiment, the output of the first gain stage (2) is coupled by means of a first cascode transistor $MP_{CASCODE}$) to the first high impedance node (3,3-1,3-2).

In one embodiment, a second Miller feedback capacitor ($C_{M2}$) is coupled between the output conductor (7) and a first electrode (i.e., source) of a second cascode transistor ($MP_{CASCODE}$) having a second electrode (i.e., drain) coupled to the first high impedance node (3,3-1,3-2).

In another embodiment, a second Miller feedback capacitor ($C_{M2}$) is coupled between the output conductor (7) and a first electrode (i.e., source) of a second cascode transistor ($MP_{CASCODE}$) having a second electrode (i.e., drain) coupled to a second high impedance node (3-2). A second gain reduction resistor ($R_{D1}$) and a second AC coupling capacitor ($C_{D1}$) are coupled in series between the second high impedance node (3-2) and a second reference voltage ($V_{DD}$).

In one embodiment, the second gain stage (5) includes a pulldown transistor (MN1) having a first electrode (i.e., source) coupled to the first reference voltage (GND), a second electrode (i.e., drain) coupled to the output conductor (7), and a control electrode (i.e., gate) coupled to the first high impedance node (3-1) and a pull-up transistor (MP1) having a first electrode (i.e., source) coupled to the second reference voltage ($V_{DD}$), a second electrode (i.e., drain) coupled to the output conductor (7), and a control electrode (i.e., gate) coupled to the second high impedance node (3-2). In a described embodiment, the second gain stage (5) includes a class AB bias stage coupled between the first (3-1) and second (3-2) high impedance nodes.

In one embodiment, a third Miller feedback capacitor ($C_{M4}$) is coupled between the output conductor (7) and the first high impedance node (3-1), and a fourth Miller feedback capacitor ($C_{M3}$) is coupled between the output conductor (7) and the second high impedance node (3-2).

In one embodiment, a boost transistor (MP2) has a first terminal (i.e., source) coupled to the second reference voltage ($V_{DD}$), a second terminal (i.e., drain) coupled to the output conductor (7) and a control terminal (i.e., gate) coupled by an isolation resistor (R3) to one of the first (3-1) and second (3-2) high impedance nodes. In one embodiment, a higher magnitude of voltage is required on the second high impedance node (3-2) in order to turn on the boost transistor (MP2) than is required to turn on the pull-up transistor (MP1).

In one embodiment, the first gain stage (2) includes first (M1) and second (M2) input transistors having control electrodes (e.g., gates) coupled to receive first ($Vin^+$) and ($Vin^-$) input signals, respectively, first electrodes (e.g., sources) coupled to a tail current source (12), and second electrodes (e.g., drains) coupled to first (11) and second (11A) inputs, respectively, of folding cascode circuitry ($MN_{CASCODE}$, $MP_{CASCODE}$, M3,4,9,10), first (3-1) and second (3-2) outputs of the folded cascode circuitry being coupled to the control electrodes of the pulldown transistor (MN1) and pull-up transistor (MP1), respectively.

In one embodiment, the invention provides a method for driving a capacitive load ($C_{LOAD}$) and/or a resistive load ($R_{LOAD}$) coupled to an output conductor (7) by means of an amplifier (10) including a first gain stage (2) having an output coupled to a first high impedance node (3) and a second gain stage (5) having an input coupled to the first high impedance node (3,3-1,3-2) and an output coupled to the output conductor (7), the method including coupling a first gain reduction resistor ($R_D$) and a first AC coupling capacitor ($C_D$) in series between the first high impedance node (3) and a first reference voltage (GND or $V_{DD}$); and coupling a first Miller feedback capacitor ($C_M$) between the output conductor (7) and the first high impedance node (3).

In one embodiment, the method includes coupling the output of the first gain stage (2) by means of the first Miller feedback capacitor ($C_M$) to the first high impedance node (3,3-1,3-2) and by means of a first cascode transistor ($M_{CASCODE}$, $MN_{CASCODE}$, $MP_{CASCODE}$).

In one embodiment, the method includes coupling a second Miller feedback capacitor ($C_{M1}$) between the output conductor (7) and a first electrode (i.e., source) of a second cascode transistor ($MP_{CASCODE}$) having a second electrode (i.e., drain) coupled to the first high impedance node (3,3-1,3-2).

In one embodiment, the method includes coupling a third Miller feedback capacitor ($C_{M4}$) between the output conductor (7) and the first high impedance node (3-1), and coupling a fourth Miller feedback capacitor ($C_{M3}$) between the output conductor (7) and the second high impedance node (3-2).

In one embodiment, the method includes coupling a boost transistor (MP2) between a second reference voltage ($V_{DD}$) and the output conductor (7) and coupling a control terminal (i.e., gate) of the boost transistor (MP2) by means of an isolation device (R3, MP3) to one of the first (3-1) and second (3-2) high impedance nodes.

In one embodiment, the invention provides circuitry for driving a capacitive load ($C_{LOAD}$) and/or a resistive load ($R_{LOAD}$) by means of an amplifier (10, 20) including a first gain stage (2) having an output coupled to a first high impedance node (3) and a second gain stage (5) having an input coupled to the first high impedance node (3,3-1,3-2), the circuitry including means ($C_D$) for AC coupling a first gain reduction resistor ($R_D$) between the first high impedance node (3) and a first reference voltage (GND or $V_{DD}$); and means (3 or $M_{CASCODE}$) for coupling a first Miller feedback capacitor ($C_M$) between an output conductor (7) of the second gain stage (5) and the first high impedance node (3).

DETAILED DESCRIPTION OF THE PREFERRED EMBODIMENTS

An operational amplifier includes a first gain stage having its output coupled to a high impedance node that is coupled to the input of a second gain stage. A gain reduction or damping resistor and an AC coupling capacitor are coupled in series between the high impedance node and a reference voltage. In one embodiment, a Miller feedback capacitor is coupled between an output of the second gain stage and a "cascode point" that is coupled to the high impedance node by means of a cascode transistor. A portion of the Miller feedback capacitance may be "split off" and fed back directly to the high impedance node. The operational amplifier is capable of maintaining high overall gain while driving a high capacitance load, a low capacitance load, or a resistive load. A drive current boosting circuit may be effectively coupled in parallel with an output transistor of the second gain stage.

Figure 2:
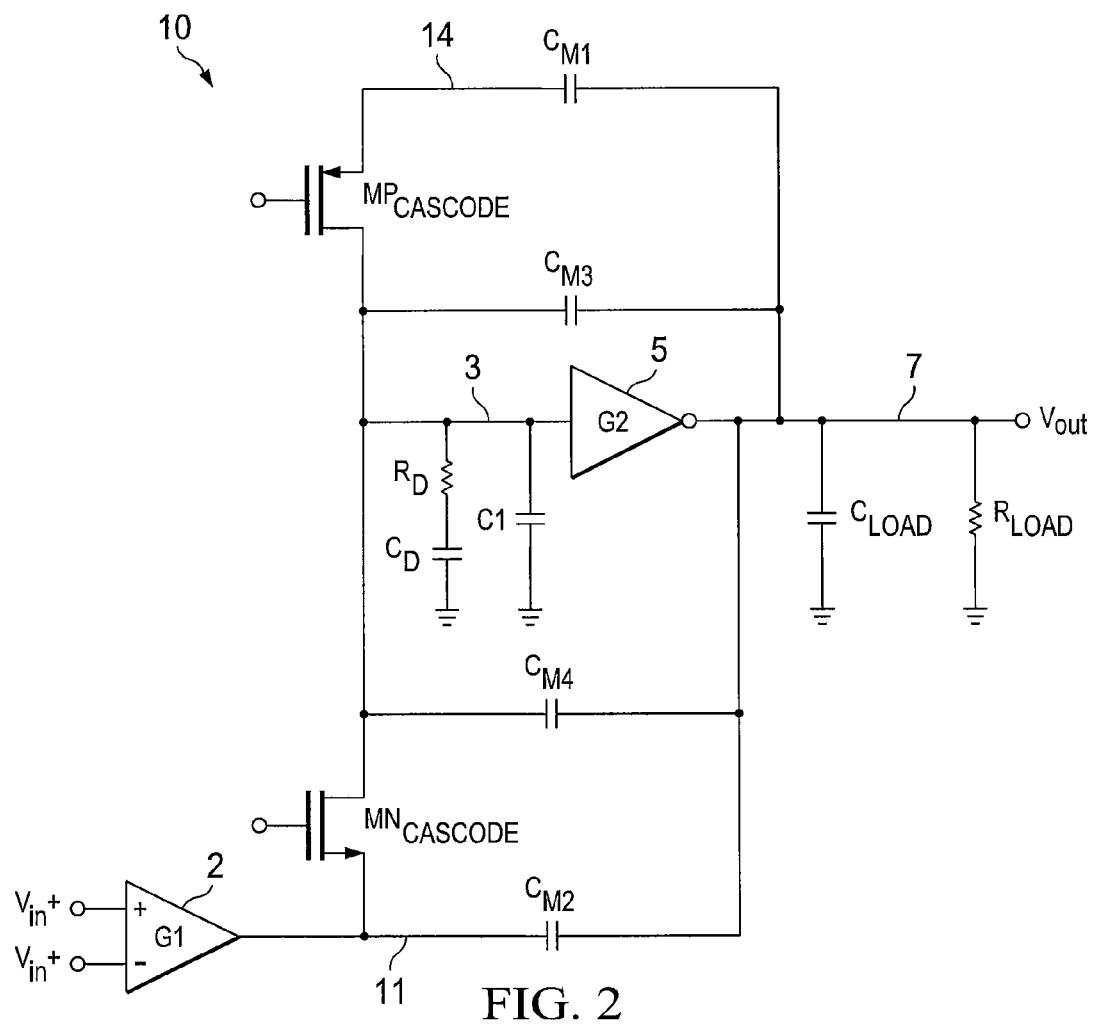
FIG. 2 is a block diagram of an improved two-stage operational amplifier.

Referring to FIG. 2, two-stage operational amplifier 10 includes a first transconductance gain stage 2 which has transconductance G1 and which may be configured as an inverting stage. The (+) input of the first gain stage 2 receives an input signal $Vin^+$ and its (−) input receives the input signal $Vin^-$. The output terminal of first gain stage 2 is connected by conductor 11 to the source of a N-channel cascode transistor $MN_{CASCODE}$ having its drain coupled by high impedance conductor or node 3 to the input of an inverting second transconductance gain stage 5 having transconductance G2. High impedance node 3 is connected to one terminal of the damping (gain reduction) resistor $R_D$. The other terminal of damping resistor $R_D$ is coupled to ground by means of an AC coupling (damping) capacitor $C_D$, which in one example of a 10 MHZ implementation, may have a capacitance of roughly 10 pF (picofarads) and the damping resistor $R_D$ may have a resistance of roughly 8 kilohms. (Of course, the positions of resistor $R_D$ and capacitor $C_D$ may be reversed, as they just need to be connected in series.)

A parasitic capacitance C1 is coupled to high impedance node 3, and may have a capacitance of roughly 2 pF. The gate of $MN_{CASCODE}$ is coupled to a suitable bias voltage. The source of $MN_{CASCODE}$ is coupled by "cascode point" 11 to one terminal of a Miller feedback capacitor $C_{M2}$, the other terminal of which is connected by conductor 7 to the output of second gain stage 5. The total "lower" Miller feedback capacitance may include, in addition to $C_{M2}$, a "split off" portion $C_{M4}$ coupled between output conductor 7 and high impedance node 3. In one example, $C_{M2}$ may have a value of 2.65 pF and split off portion $C_{M4}$ may have a value of 0.33 pF. An output voltage Vout is generated on output conductor 7 and is applied to load capacitance $C_{LOAD}$. A load resistance $R_{LOAD}$ may be coupled between output conductor 7 and ground instead of or in addition to load capacitance $C_{LOAD}$.

Similarly, two-stage operational amplifier 10 also includes a P-channel cascode transistor $MP_{CASCODE}$ having its drain coupled by high impedance node 3 to the input of second transconductance gain stage 5. The gate of $MP_{CASCODE}$ is coupled to a suitable bias voltage. The source of $MP_{CASCODE}$ is coupled by another "cascode point" 14 to one terminal of another Miller feedback capacitor $C_{M1}$, the other terminal of which is connected by output conductor 7 to the output of second gain stage 5. The total "upper" Miller feedback capacitance may include, in addition to $C_{M1}$, a "split off portion" $C_{M3}$ coupled between output conductor 7 and high impedance node 3. In one example, $C_{M1}$ may have a value of 2.65 pF and split off portion $C_{M3}$ may have a value of 0.33 pF. (It should be noted that split off Miller capacitance portions $C_{M3}$ and $C_{M4}$ are not always essential, but in most cases they will improve the light load capacitance stability of operational amplifier 10. Also, it should be noted that use of two cascode transistors is not essential. Operational amplifier 10 of FIG. 2 could also be implemented with only a single cascode transistor and a single Miller feedback capacitor. Using two cascode transistors usually works best but is not always essential, because bypassing coupling the Miller feedback capacitor directly from output conductor 7 to the high impedance node 3 may help amplifier stability when it is driving a relatively low load capacitance.)

Coupling of gain reduction resistor $R_D$ directly between high impedance node 3 and ground reduces the gain of first gain stage 2. However, the AC coupling of gain reduction resistor $R_D$ in operational amplifier 10 by means of AC coupling capacitor $C_D$ effectively isolates gain reduction resistor $R_D$ from the output of first gain stage 2, so for DC and low-frequency operation, the gain of first gain stage 2 is equal to what it would be with gain reduction resistor $R_D$ removed. The AC coupling of gain reduction resistor $R_D$ also improves the stability of operational amplifier 10 when driving small capacitive loads, as $R_D$ and $C_D$ create a zero within each Miller feedback loop, which helps to cancel the inner loop pole created by the corresponding cascoded Miller capacitor and the transconductance of the corresponding cascode transistor.

In addition to providing the above-mentioned AC coupling of gain reduction resistor $R_D$ to ground (or other fixed reference), it is also desirable to move most of the total Miller feedback capacitance to the cascode point, because this reduces the total capacitance on high impedance node 3, and that allows the use of a larger damping resistor $R_D$ and therefore a smaller damping capacitor $C_D$. "Split off" Miller capacitors $C_{M3}$ and $C_{M4}$ may be required to keep the amplifier stable at small capacitive loads, especially if transconductance G2 is high due to DC load currents. (A "low capacitance load" may be considered to be a capacitance of roughly the same value as the total Miller capacitance $C_M$, and a "high capacitance load" may be considered to be roughly 100 times the total Miller capacitance value.) Since $R_D$ and $C_D$ provide a zero within the inner Miller feedback loop, partially cancelling the pole due to the Miller capacitors ($C_{M1}$ and $C_{M2}$) within the inner Miller Loop and the transconductance (Gm) of the cascode transistors, a high percentage of the total Miller capacitance can be connected to the cascode points 11 and 14 and relatively small values for split off portions $C_{M3}$ and $C_{M4}$ can be used.

In this example, the 2.65 pF Miller feedback capacitor C is coupled between output conductor 7 and lower cascode point 11 to the source of cascode transistor $MN_{CASCODE}$, and that adds a pole to the transfer characteristic of the loop including second gain stage 5, cascode transistor $MN_{CASCODE}$, and its associated Miller feedback compensation, because of the transconductance of $MN_{CASCODE}$. The previously described problem of operational amplifier 1 in Prior Part FIG. 1B being unable to drive a low capacitance loads because the feedback loop including second gain stage 5 needs to be stable, is solved by the AC coupling of gain reduction resistor $R_D$ to ground by means of damping capacitor $C_D$, because the damping network including gain reduction resistor RD and damping capacitor CD adds a transfer characteristic zero to the loop including second gain stage 5, cascode transistor MNCASCODE, and its associated Miller feedback compensation. That "added" zero can cancel the pole associated with cascode transistor $MN_{CASCODE}$, and its associated Miller feedback compensation. This allows the bandwidth of the Miller feedback loop to drop for high capacitive loads, with the damping network being used to control the phase shift from the first gain stage 2. In addition to controlling the phase shift from the first gain stage 2, the damping network in the present invention adds a zero to the transfer characteristic of the Miller feedback network to compensate for the pole (within the Miller feedback loop) caused by the transconductance of the cascode transistor. This is considerably different than the approach described in the previously mentioned article by Leung et al.

Thus, the circuitry in operational amplifier 10 "recovers" the amount of gain of first gain stage 2 lost as a result of $R_D$ being directly connected to ground and allows operational amplifier 10 to actually drive low-capacitance loads by adding a zero to cancel the pole in each cascode feedback loop.

It should be noted that the splitting or separating of the total of Miller feedback from output conductor 7 to the two cascode points 11 and 14 provides a higher effective transconductance of the cascode transistors, which allows a higher percentage of the total Miller capacitance to be coupled to the cascode points instead of the high impedance node 3, and therefore reduces the amounts of capacitive loading on the high impedance node 3. This allows use of a smaller amount of damping capacitance $C_D$.

Figure 1A:
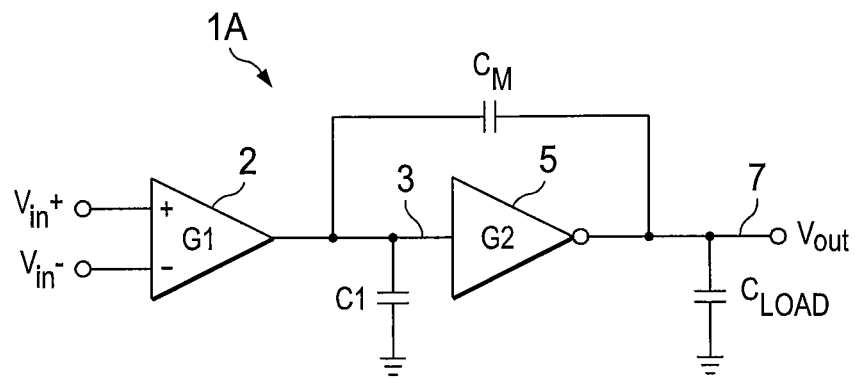
FIG. 1A is a block diagram of a conventional two-stage operational amplifier with conventional Miller feedback compensation.
Figure 1B:
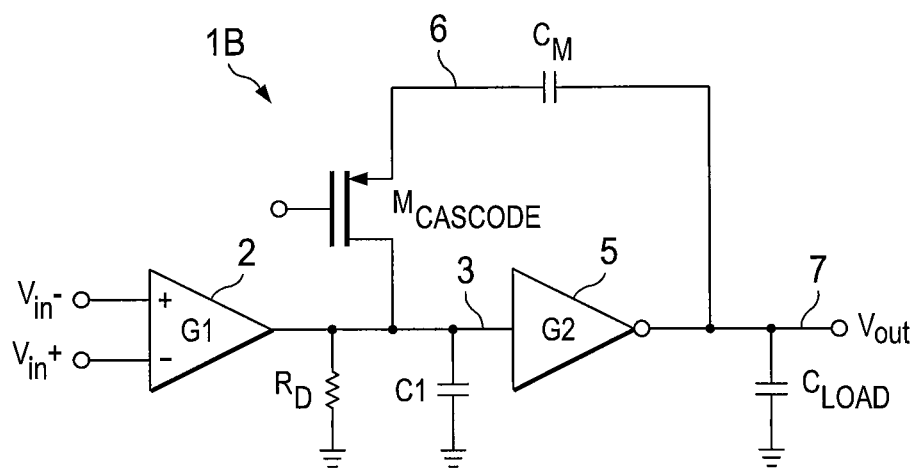
FIG. 1B is a block diagram of a prior art two-stage operational amplifier similar to the one shown in FIG. 1A but further including a cascode transistor coupled between the Miller feedback capacitor and the high impedance node and a gain reduction resistor coupled between the high impedance node and ground.
Figure 3A:
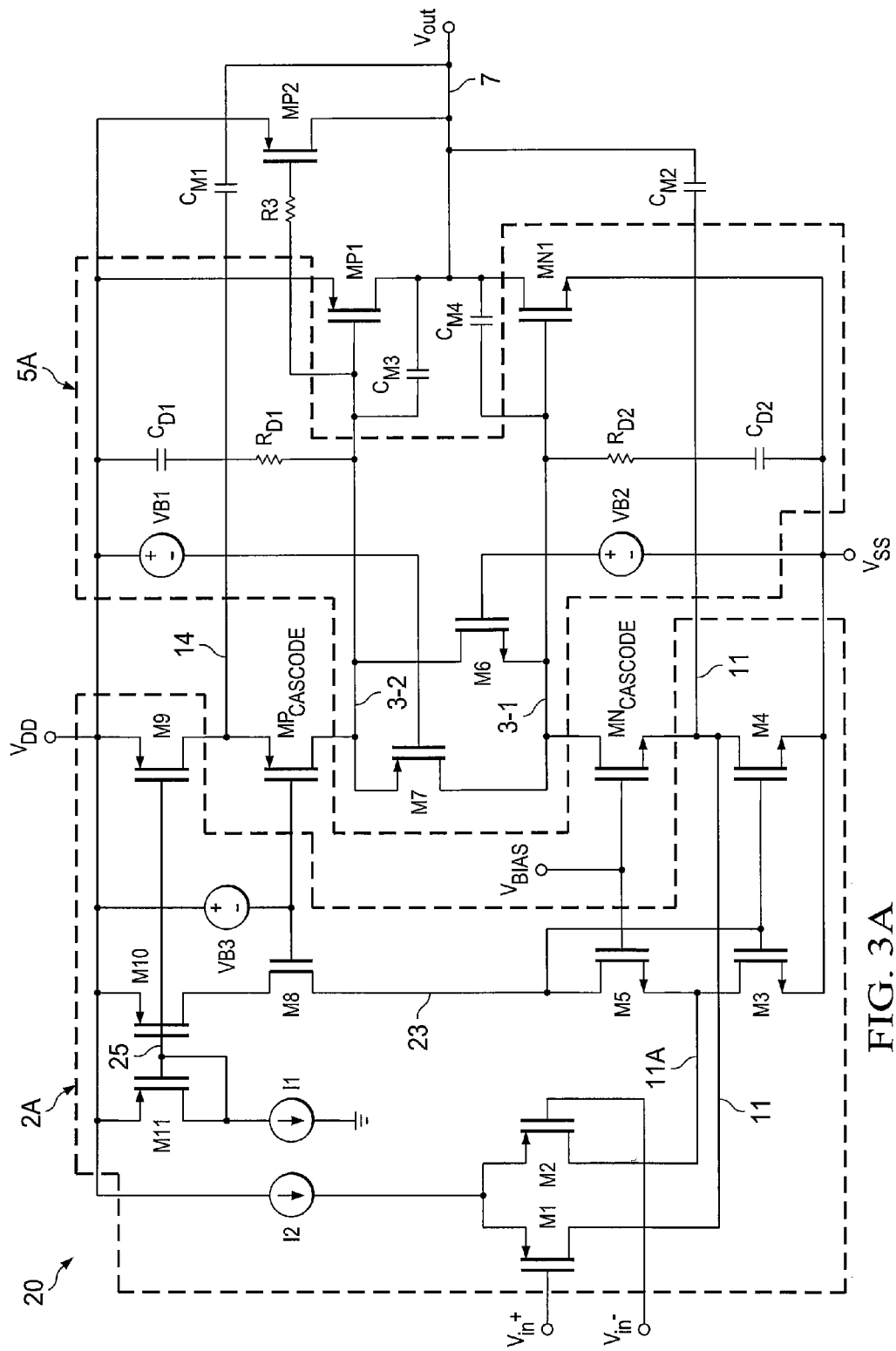
FIG. 3A is a schematic diagram of the operational amplifier of FIG. 2 further including an output current boosting circuit.

The compensation technique shown in operational amplifier 10 of FIG. 2 solves the two-stage DC gain problem that is characteristic of the two-stage amplifier shown in Prior Art FIG. 1B, by AC coupling the first stage gain reduction (damping) resistor to ground, instead of directly connecting it to ground. Also, the RC damping network including $R_D$ and $C_D$ improves the stability of the inner Miller feedback loop. This allows a larger percentage of the total Miller capacitance to be moved to the cascode point (or two cascode points as shown in FIGS. 2 and 3A) and keeps the capacitance on the high impedance node 3 low so the AC coupling capacitor (damping capacitor) value can also be kept low enough that it does not adversely impact other performance aspects of the amplifier. The resulting two-stage operational amplifier 10 in FIG. 2 is a low power, general purpose operational amplifier that is able to drive a wide range of load capacitance and resistance without the performance limitations and high power consumption of prior architectures that are designed mainly to drive high load capacitances.

If the damping capacitor $C_D$ becomes larger than the Miller compensation capacitor, the gain around the Miller loop will be lower than the gain provided by standard Miller compensation. This would result in a loss of bandwidth when amplifier 10 of FIG. 2 is driving small value resistive loads. Damping capacitor $C_D$ also creates a pole/zero pair that slightly degrades the amplifier settling time (by approximately 20% in one example).

FIG. 3A shows a schematic diagram of an operational amplifier 20 which includes all of the circuitry indicated in FIG. 2 and further includes a current boost circuit that provides additional drive current without increasing the capacitance at a high impedance node 3-2. First gain stage 2A in FIG. 3A corresponds to first gain stage 2 in FIG. 2, and includes a pair of differentially coupled P-channel input transistors M1 and M2 having their sources connected to a tail current source 12. The gate of input transistor M1 is coupled to Vin+ and its drain is connected by conductor 11 to the drain of a N-channel transistor M4 having its source connected to $V_{SS}$. Similarly, the gate of input transistor M2 is coupled to Vin− and its drain is connected by conductor 11A to the drain of a N-channel transistor M3 having its source connected to $V_{SS}$. Conductor 11 (i.e., cascode point 11) also is connected to the source of N-channel cascode transistor $MN_{CASCODE}$, which has its drain connected to a high impedance conductor or node 3-1. The gates of cascode transistors M5 and $MN_{CASCODE}$ are connected to a bias voltage $V_{BIAS}$. Conductor 11A also is connected to the source of a N-channel cascode transistor M5 having its drain connected to conductor 23. Conductor 23 is also connected to the gates of transistors M3 and M4. Transistors M3 and M4 of the differential input stage therefore function as a current mirror input transistor and a current mirror output transistor, respectively.

Conductor 23 also is connected to the drain of a P-channel cascode transistor M8 having its source connected to the drain of a P-channel transistor M10 having its source connected to $V_{DD}$ and its gate connected by conductor 25 to the gate and drain of a P-channel current mirror input transistor M11 having its source connected to $V_{DD}$. Conductor 25 also is connected to a current source I1 that is referenced to ground. Conductor 25 also is connected to the gate of a P-channel transistor M9 having its source connected to $V_{DD}$ and its drain connected to cascode point 14 and the source of a P-channel cascode transistor $MP_{CASCODE}$ which has its gate connected to a voltage source VB3 and its drain connected to high impedance conductor or node 3-2.

Second gain stage 5A in FIG. 3A corresponds to second gain stage 5 in FIG. 2, and includes a N-channel output pulldown transistor MN1 having its source connected to $V_{SS}$ and its gate connected to high impedance node 3-1. A gain reduction resistor $R_{D2}$ is coupled between high impedance node 3-1 and one terminal of an AC coupling capacitance $C_{D2}$ which is referenced to $V_{SS}$. Another gain reduction resistor $R_{D1}$ is coupled between high impedance node 3-2 and one terminal of an AC coupling capacitance $C_M$ which is referenced to $V_{DD}$. A "lower side" Miller feedback capacitor CM2 is connected between output conductor 7 and cascode point 11, and an "upper side" Miller feedback capacitor CM1 is connected between output conductor 7 and cascode point 14. A lower side split-off portion CM4 of Miller feedback capacitance is coupled between output conductor 7 and high impedance node 3-1. Similarly, an upper side split-off portion CM3 of Miller feedback capacitance is coupled between output conductor 7 and high impedance node 3-2.

Second gain stage 5A further includes a standard class AB bias stage (also known as a Monticelli circuit) which includes a P-channel transistor M7 having its source connected to high impedance node 3-2, its gate connected to a bias voltage source VB1, and its drain connected to high impedance node 3-1. The class AB bias stage also includes a N-channel transistor M6 having its source connected to high impedance node 3-1, its drain connected to high impedance node 3-2, and its gate connected to a bias voltage source VB2.

Operational amplifier 20 in FIG. 3A further includes a current booster circuit including a P-channel boost transistor MP2 which, in this example, has a higher magnitude threshold voltage than pull-up transistor MP1. The source of boost transistor MP2 is connected to $V_{DD}$ and its drain is connected to output conductor 7. The gate of boost transistor MP2 is coupled by isolation resistor R3 to the gate of output transistor MP1, i.e., to high impedance node 3-2. Therefore, boost transistor MP2 adds essentially no capacitance to the high impedance node 3-2 and consequently causes essentially no degrading of the Miller feedback compensation. Since current boost transistor MP2 has a higher magnitude threshold voltage than pull-up transistor MP1 and since its gate is isolated from high impedance node 3-1 by isolation resistor R3 during ordinary low-load operation, boost transistor MP2 is turned off and consumes no operating power during ordinary low-load operation, and is turned on only when operational amplifier 20 is driving a very large load current.

Pull-up transistor MP1 is sized sufficiently large to provide all of the needed high frequency output current. Boost transistor MP2 allows reduction of the size of pull-up transistor MP1, which lowers the capacitance on high impedance node 3-2, and therefore allows the use of a larger value of $R_D$ and a smaller value of $C_D$. The gain reduction resistance $R_D$ and AC coupling capacitor $C_D$ are split into 2 networks ($R_{D1}/C_{D1}$ and $R_{D2}/C_{D2}$) for symmetry. The output current booster circuit including boost transistor MP2 and isolation resistor R3 produces essentially no degradation of Vout settling time, because boost transistor MP2 only is turned on at high output current when the Miller loop bandwidth is very high. (Note that the foregoing current boost circuit can be used in conjunction with any type of compensation to provide improved performance. It works particularly well with the new compensation scheme shown in FIGS. 2 and 3, in that the new compensation scheme is more sensitive to capacitance at the high impedance node than some other approaches. The current boost circuit provides high output drive current without increasing the capacitance at the high impedance node.)

If isolation resistor R3 is sized so that the time constant of the damping network including $R_{D1}$ and $C_{D1}$ is the same as the time constant of R3 and the gate capacitance of MP2, then R3 and the gate capacitance of MP2 work as part of the damping network. The circuit is tolerant of large mismatches in these two time constants, however.

The benefit of current booster transistor MP2 and isolation resistor R3 is to achieve high output current drive without increasing the capacitance at the high impedance node 3-2. This current booster circuit increases the output drive of operational amplifier 20 with no degradation due to the Miller feedback compensation. In the above described implementation, there still is a very slight light load capacitance problem with using the capacitively coupled damping resistor. Solving that problem is the reason for splitting a 0.33 pF part of the Miller capacitance to the high impedance node. That tends to bypass high-frequency around the cascode transistor.

Figure 3B:
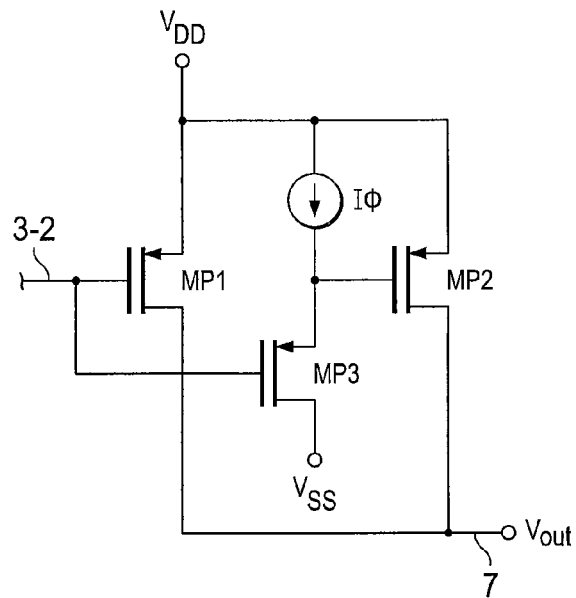
FIG. 3B is a schematic diagram of an alternative output current boosting circuit which may be used in the operational amplifier of FIG. 2.

FIG. 3B illustrates an alternative output current boosting circuit which may be used in the operational amplifier of FIG. 2. In FIG. 3B, P-channel pull-up transistor MP1 and P-channel boost transistor MP2 are connected the same as in FIG. 3A. However, boost transistor MP2 does not need to have a higher magnitude threshold voltage than pull-up MP1 in order to keep boost transistor MP2 turned off under low load current conditions. Instead, the source of a P-channel transistor MP3 is connected to the gate of boost transistor MP2 and to a current source I0 which is referenced to $V_{DD}$. The gate of transistor MP3 is connected to high impedance node 3-2, and its drain is connected to $V_{SS}$. All of the transistors MP1, MP2, and MP3 may be of the same device type, with equal threshold voltages. The channel-width-to-channel-length ratio of transistor MP3, which isolates the gate capacitance of boost transistor MP2 from high impedance node 3-2, may be much smaller than the channel-width-to-channel-length ratio of boost transistor MP2.

Figure 4:
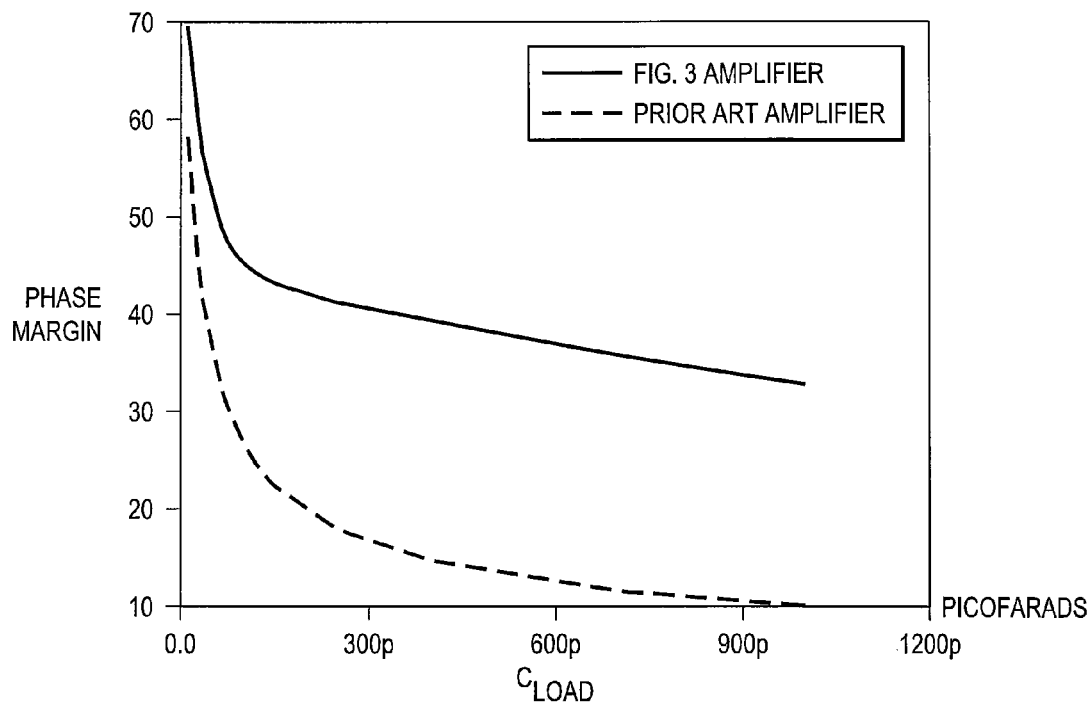
FIG. 4 shows a comparison of the phase margin versus load capacitance curve for the operational amplifier of FIG. 3 to the phase margin versus load capacitance curve of an otherwise comparable conventional operational amplifier that uses Miller compensation as indicated in Prior Art FIG. 1A.

FIG. 4 includes simulated curves showing a comparison of the new compensation technique of FIGS. 2, 3A, and 3B in an amplifier with conventional Miller compensation as shown in Prior Art FIG. 1A. Specifically, an operational amplifier has been designed using the compensation approach of FIG. 3A and compared to an amplifier which is the same except that it is compensated with standard Miller compensation. The operational amplifiers compared in FIG. 4 are essentially identical except for the compensation technique utilized, in that both operational amplifiers use the same CMOS manufacturing process, and both have similar noise, operating voltage range, and quiescent power supply current values. The compensation circuitry shown in FIG. 3A provides 25 to 35 degrees of additional phase margin compared to the amplifier compensated as shown in Prior Art FIG. 1. The compensation circuitry in FIG. 3A extends the useful capacitive load-driving range by roughly a factor of 10. In another amplifier implementation, the operational amplifier compensated generally as shown in FIG. 3 was found to have roughly 3 times the bandwidth and three times the capacitive load drive capability as the existing amplifier compensated generally as indicated in Prior Art FIG. 1A, and had no significant stability problems driving low capacitive loads.

The technique of the described invention can be used to provide a general purpose operational amplifier capable of driving a very wide range of capacitive loads and also capable of driving a resistive load, without the low DC gain and large power consumption of conventionally compensated amplifiers.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the RC damping network could also be implemented with an active circuit (such as a capacitance multiplier circuit), and there are various similar but slightly different ways to implement the current booster.

What is claimed is:

1. Amplifier circuitry comprising:
   a first gain stage having an output coupled to a first high impedance node;
   a first gain reduction resistor and a first AC coupling capacitor coupled in series between the first high impedance node and a first reference voltage;
   a second gain stage having an input coupled to the first high impedance node;
   a first Miller feedback capacitor coupled between an output conductor of the second gain stage and the first high impedance node;
   a second Miller feedback capacitor coupled between the output conductor and a first electrode of a second cascode transistor having a second electrode coupled to a second high impedance node;
   a second gain reduction resistor and a second AC coupling capacitor coupled in series between the second high impedance node and a second reference voltage;
   wherein the output of the first gain stage is coupled by means of a first cascode transistor to the first high impedance node.

2. The amplifier circuitry of claim 1 wherein the second gain stage includes a pulldown transistor having a first electrode coupled to the first reference voltage, a second electrode coupled to the output conductor, and a control electrode coupled to the first high impedance node, and a pull-up transistor having a first electrode coupled to the second reference voltage, a second electrode coupled to the output conductor, and a control electrode coupled to the second high impedance node.

3. The amplifier circuitry of claim 1 including a boost transistor having a first electrode coupled to the second reference voltage, a second electrode coupled to the output conductor and a control electrode coupled by an isolation device to the second high impedance node.

4. The amplifier circuitry of claim 2 wherein the second gain stage includes a class AB bias stage coupled between the first and second high impedance nodes.

5. The amplifier circuitry of claim 2 wherein the first gain stage includes first and second input transistors having control electrodes coupled to receive first and second input signals, respectively, first electrodes coupled to a tail current source, and second electrodes coupled to first and second inputs, respectively, of folding cascode circuitry, first and second outputs of the folded cascode circuitry being coupled to the control electrodes of the pulldown transistor and pull-up transistor, respectively.

6. The amplifier circuitry of claim 3 wherein the isolation device includes an isolation resistor and wherein the boost transistor has a threshold voltage of greater magnitude than the pull-up transistor.

7. Amplifier circuitry comprising:
   a first gain stage having an output coupled to a first high impedance node;
   a first gain reduction resistor and a first AC coupling capacitor coupled in series between the first high impedance node and a first reference voltage;
   a second gain stage having an input coupled to the first high impedance node; and
   a first Miller feedback capacitor coupled between an output conductor of the second gain stage and the first high impedance node;
   wherein the first gain reduction resistor has a first terminal connected to the first high impedance node and a second terminal connected to a first terminal of the first AC coupling capacitor, the first AC coupling capacitor having a second terminal coupled to the first reference voltage.

8. A method for driving a capacitive load and/or a resistive load coupled to an output conductor by means of an amplifier including a first gain stage having an output coupled to a first high impedance node and a second gain stage having an input coupled to the first high impedance node and an output coupled to the output conductor, the method comprising:
   coupling a first gain reduction resistor and a first AC coupling capacitor in series between the first high impedance node and a first reference voltage; and
   coupling a first Miller feedback capacitor between the output conductor and the first high impedance node;
   coupling the output of the first gain stage to the first high impedance node by means of a first cascode transistor; and
   coupling a boost transistor between a second reference voltage and the output conductor and coupling a control terminal of the boost transistor by means of an isolation device to the second high impedance node.

* * * * *